United States Patent
McMillen et al.

(10) Patent No.: US 7,503,258 B2
(45) Date of Patent: Mar. 17, 2009

(54) METHOD AND APPARATUS FOR THERMAL DEVELOPMENT WITH DEVELOPMENT MEDIUM REMOVER

(75) Inventors: Robert A. McMillen, Downingtown, PA (US); Dietmar Dudek, Langen (DE); Mark A. Hackler, Ocean, NJ (US); Anandkumar R. Kannurpatti, E. Windsor, NJ (US); John W. Trainor, Jr., Vestal, NY (US)

(73) Assignee: E. I. Du Pont de Nemours & Company, Wilmington, DE (US)

( * ) Notice: Subject to any disclaimer, the term of this patent is extended or adjusted under 35 U.S.C. 154(b) by 201 days.

(21) Appl. No.: 11/191,807

(22) Filed: Jul. 28, 2005

(65) Prior Publication Data

US 2006/0029880 A1 Feb. 9, 2006

Related U.S. Application Data

(60) Provisional application No. 60/598,559, filed on Aug. 3, 2004.

(51) Int. Cl.
*B41C 3/08* (2006.01)
*B41N 6/00* (2006.01)
*G03F 7/00* (2006.01)
*G03F 7/26* (2006.01)
*G03F 1/00* (2006.01)

(52) U.S. Cl. ............... 101/401.1; 430/300; 430/306; 430/309; 430/330

(58) Field of Classification Search .......... 430/5, 430/300, 306, 309, 330, 348, 413; 101/128.4, 101/401.1; 427/510; 118/60, 109; 156/555, 156/556, 583.1, 583.4
See application file for complete search history.

(56) References Cited

U.S. PATENT DOCUMENTS

| | | | | |
|---|---|---|---|---|
| 4,337,220 A | * | 6/1982 | Arimatsu | ............ 264/493 |
| 5,153,656 A | | 10/1992 | Johnson et al. | |
| 5,164,744 A | | 11/1992 | Yoshida et al. | |
| 5,279,697 A | | 1/1994 | Peterson et al. | |
| 5,835,837 A | | 11/1998 | Saitoh et al. | |
| 6,797,454 B1 | * | 9/2004 | Hackler et al. | ............ 430/306 |
| 7,156,630 B2 | * | 1/2007 | Roberts et al. | ............ 425/73 |
| 7,202,008 B2 | * | 4/2007 | Roshelli et al. | ............ 430/254 |
| 7,232,649 B2 | * | 6/2007 | Vest | ............ 430/306 |
| 7,237,482 B2 | * | 7/2007 | Vest et al. | ............ 101/401.1 |
| 2002/0067936 A1 | | 6/2002 | Yasui et al. | |

FOREIGN PATENT DOCUMENTS

| | | |
|---|---|---|
| EP | 0 654347 | 5/1995 |
| JP | 7 092693 | 4/1995 |
| WO | WO 01/18604 A2 | 3/2001 |

* cited by examiner

*Primary Examiner*—Anthony H Nguyen
*Assistant Examiner*—Leo T Hinze
(74) *Attorney, Agent, or Firm*—Thomas H. Magee

(57) ABSTRACT

This invention relates to a method and apparatus for thermally developing a photosensitive element. The thermal development method includes heating the photosensitive element to a temperature sufficient to cause a portion of a composition layer in the element to liquefy, soften, or melt, contacting the heated photosensitive element with a development medium to absorb the liquefied portion at a contact location, and removing the development medium from the photosensitive element with a remover at a location away from the contact location.

76 Claims, 2 Drawing Sheets

METHOD AND APPARATUS FOR THERMAL DEVELOPMENT WITH DEVELOPMENT MEDIUM REMOVER

BACKGROUND OF THE INVENTION

1. Field of the Invention

This invention pertains to a method and apparatus for thermally developing a photosensitive element, and particularly to a method and apparatus that removes a development medium from the photosensitive element at a location away from where the development medium is contacted to the photosensitive element.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, photopolymerization of the photo-polymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is separated/removed from the photosensitive layer. The cycle of heating and contacting the photosensitive layer may need to be repeated several times in order to sufficiently remove the flowable composition from the unirradiated areas and form a relief structure suitable for printing. After such processing, there remains a raised relief structure of irradiated, hardened composition that represents the irradiated image.

Processors for thermal development of flexographic printing elements are known. U.S. Pat. No. 5,279,697 describes an automated process and apparatus for handling an irradiated printing element and accomplishing repeated heating and pressing to remove the unirradiated composition from the element. WO 2001/18604 also describes a method and apparatus for thermal processing a photosensitive element. In both thermal processing apparatuses the absorbent material is a continuous sheet of a web, typically a non-woven, which is pulled from a supply roll and passed over a hot roll to heat the web. The hot roll is urged toward a drum carrying the photosensitive element, thereby pressing the heated web against an exterior surface of the photosensitive element. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent web. As the drum and hot roll rotate in contact together, the web is pressed against the photosensitive element to absorb the liquefied unirradiated composition and is then pulled away from the element, thereby separating the absorbed composition from the photosensitive element. WO 2001/18604 indicates that due to heat transfer characteristics of the photosensitive element it is necessary to separate the web from the element immediately after absorption. This is accomplished by pulling the web away from the element just after the nip in a direction of about 90 degrees from the direction of travel of the element as the web continues its wrap about the hot roll. The web is transported away from the hot roll and rewound on to a take-up roll. Several cycles of passing the photosensitive element past the hot roll are repeated to progressively remove the unirradiated composition from the element.

A problem arises in these thermal development processors in that the removal of the absorbent web from the still warm photosensitive element can induce defects in the resulting relief element. In actual operation of the thermal processors as described above, the web separates from the photosensitive element at any location in a substantially triangular-shaped region after the nip. The substantially triangular-shaped region is located adjacent the hot roll and drum and has a first vertex after the nip, along the surface of the drum to a second vertex located about where the photosensitive element is in its lowest position on the drum, and along a take-up side of the hot roll to a third vertex which extends into a space below and beyond the hot roll. This substantially triangular-shaped region is approximately (10 inch) by (3-6 inch) by (6-10 inch) ((25.4 cm) by (7.6-15.2 cm) by (15.2-25.4 cm)) in cross-section. The location at which the web separates from the element can uncontrollably vary in the described triangular-shaped region, and also along the width of the element, depending upon several factors, such as, the relief image being formed, the thickness of the plate, the thermal development conditions including pressure, temperature, cycle, web speed, nip geometry, and flux of heat, etc. The separating web, which is under velocity control in commercial thermal processors, can cause the element to pass through the nip faster than expected, i.e., slip through the nip. As such, the photosensitive element can lift off the drum or sag and separate from the drum surface after the nip into the described region as the web is being pulled away from the photosensitive element. Although the drum includes a tacky surface to hold the plate to the drum, the degree of tack at times can be insufficient to prevent the element from slipping through the nip. Uncontrolled separation of the web and the lifting or sagging of the photosensitive element while the element is still hot, bends the element and induces strains in the structure of the element which creates a defect, called waves, in the resulting relief element. The non-uniform strains imparted in the element while the support is at a temperature higher than the glass transition temperature result in deformations that remain after the element has cooled or returned to room temperature. The deformations are waves of localized distortions resulting in a non-planar topography of the photosensitive element. Because of the uncontrolled nature of the web separation in thermal development of the prior art, waves of distortions can form in different locations in each element processed.

Relief printing forms having waves result in poor print performance. In multicolor printing, when one or more of the relief printing forms have waves the printed image has poor registration. Even in single color printing, waves in the relief printing form may print an image that is not an accurate reproduction of its original, so called image infidelity, by printing straight lines as curves for example. Further, the relief printing form having waves may incompletely print the image due to intermittent contact of the inked surface of the printing form to the printed substrate.

SUMMARY OF THE INVENTION

The present invention provides for an apparatus for forming a relief pattern from a photosensitive element having an exterior surface and containing a composition layer capable of being partially liquefied. The apparatus includes means for heating the exterior surface to a temperature sufficient to cause a portion of the layer to liquefy; means for contacting the exterior surface to a development medium; means located away from the exterior surface for applying tension to the development medium; and means located adjacent the exterior surface for removing the development medium from the exterior surface; wherein the means for removing is located away from the means for contacting.

In accordance with another aspect of this invention there is provided a method for forming a relief pattern from a photosensitive element from a photosensitive element having an exterior surface and containing a composition layer capable of being partially liquefied. The method includes heating the exterior surface to a temperature sufficient to cause a portion of the layer to liquefy; contacting the exterior surface to a development medium; applying tension to the development medium away from the exterior surface; and removing the development medium from the exterior surface, adjacent the exterior surface, wherein removing step is performed at a location away from the contacting step.

BRIEF DESCRIPTION OF THE DRAWINGS

The invention can be more fully understood from the following detailed description thereof in connection with the accompanying drawing described as follows.

DESCRIPTION OF THE PREFERRED EMBODIMENT(S)

Figure 1:
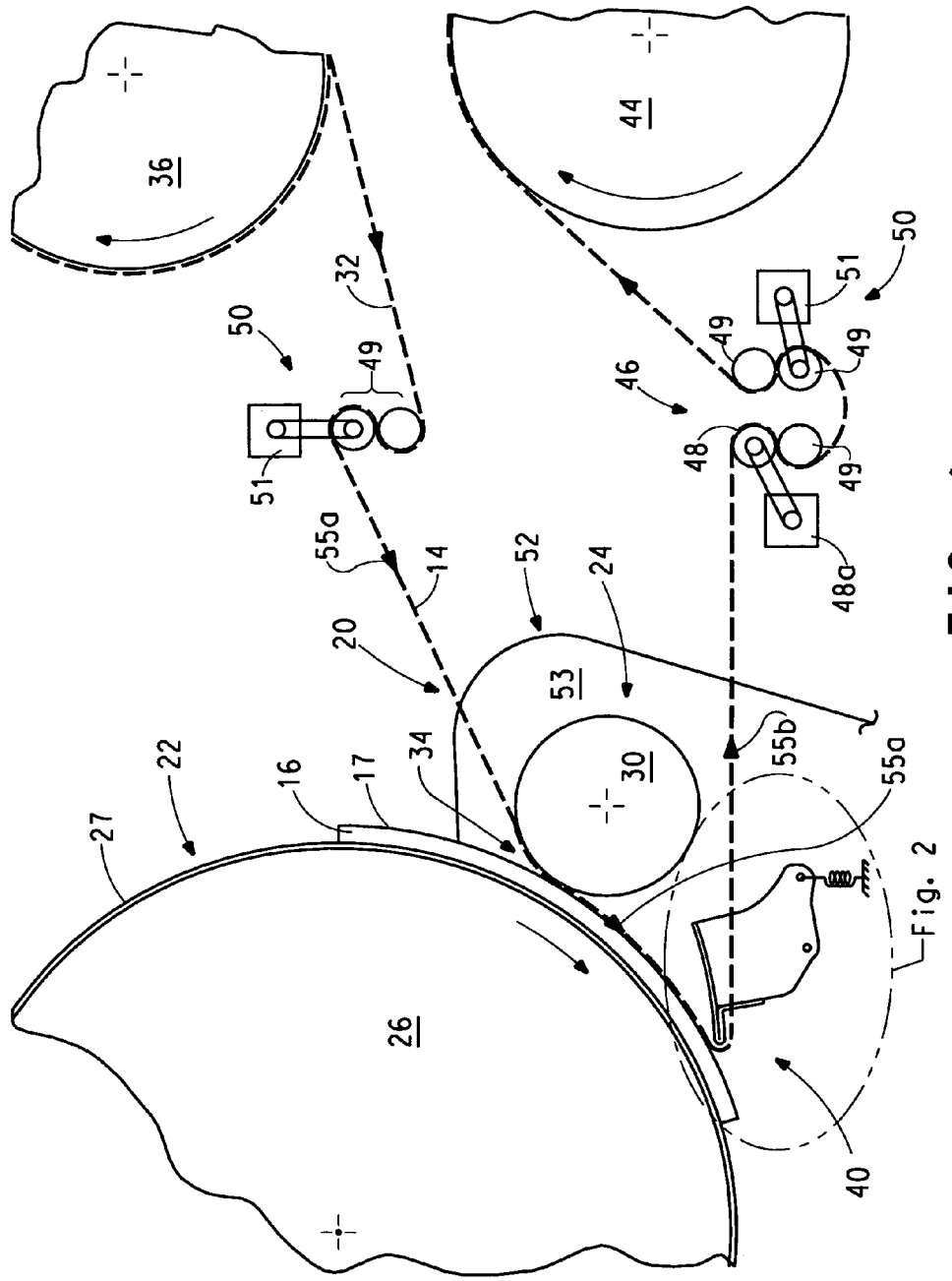
FIG. 1 is a schematic side view of an embodiment of the present invention depicting a means for removing a development medium from a photosensitive element located away from a means for contacting the development medium to the photosensitive element.

Throughout the following detailed description, similar reference characters refer to similar elements in all figures of the drawings.

The present invention is an apparatus and process for thermally developing a photosensitive element, preferably to form a flexographic printing plate. The present invention contemplates an apparatus capable of heating a photosensitive element having a layer of composition capable of being partially liquefied to a temperature sufficient to melt or soften or liquefy at least a portion of the layer for any purpose. In particular, the present invention relates to an apparatus and process for removing a development medium form the photosensitive element during thermal development.

Thermal development heats the photosensitive element 16 to a development temperature that causes uncured portions of the composition layer to liquefy, i.e., melt or soften or flow, and be carried away by contact with a development medium 14. The development medium 14 may also be referred to herein as development material, absorbent material, absorbent web, and web. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. Nos. 5,015,556; 5,175,072; 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the development medium. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

An apparatus suitable for thermally developing the photosensitive element is disclosed by U.S. Pat. No. 5,279,697, and also by Johnson et al. in Patent Cooperation Treaty Publication No. WO 01/18604 A2. The photosensitive element in all embodiments is in the form of a plate. However, it should be understood that one of ordinary skill in the art could modify each of the disclosed apparatuses to accommodate the mounting of the photosensitive element in the form of a cylinder or a sleeve.

In the present invention, thermal development includes heating of an exterior surface 17 of the composition layer of the photosensitive element 16 to a temperature Tr sufficient to cause a portion of the layer to liquefy. The at least one photosensitive layer 16 (and additional layer/s if present) can be heated by conduction, convection, radiation or other heating methods to a temperature sufficient to effect melting of the uncured portions but not so high as to effect distortion of the cured portions of the layer. One or more additional layers disposed above the composition layer may soften or melt or flow and be absorbed as well by a development medium. The development medium 14 is a material absorbent to the uncured portions of the composition layer. The photosensitive element 16 is heated to a surface temperature above about 40° C., preferably from about 40° C. to about 230° C. (104-446° F.) in order to effect melting or flowing of the uncured portions of the composition layer. The thermal treating steps of heating the photosensitive element 16 and contacting an outermost surface of the element with the development medium 14 can be done at the same time, or in sequence provided that the uncured portions of the photopolymerizable layer are still soft or in a melt state when contacted with the development medium.

Figure 2:
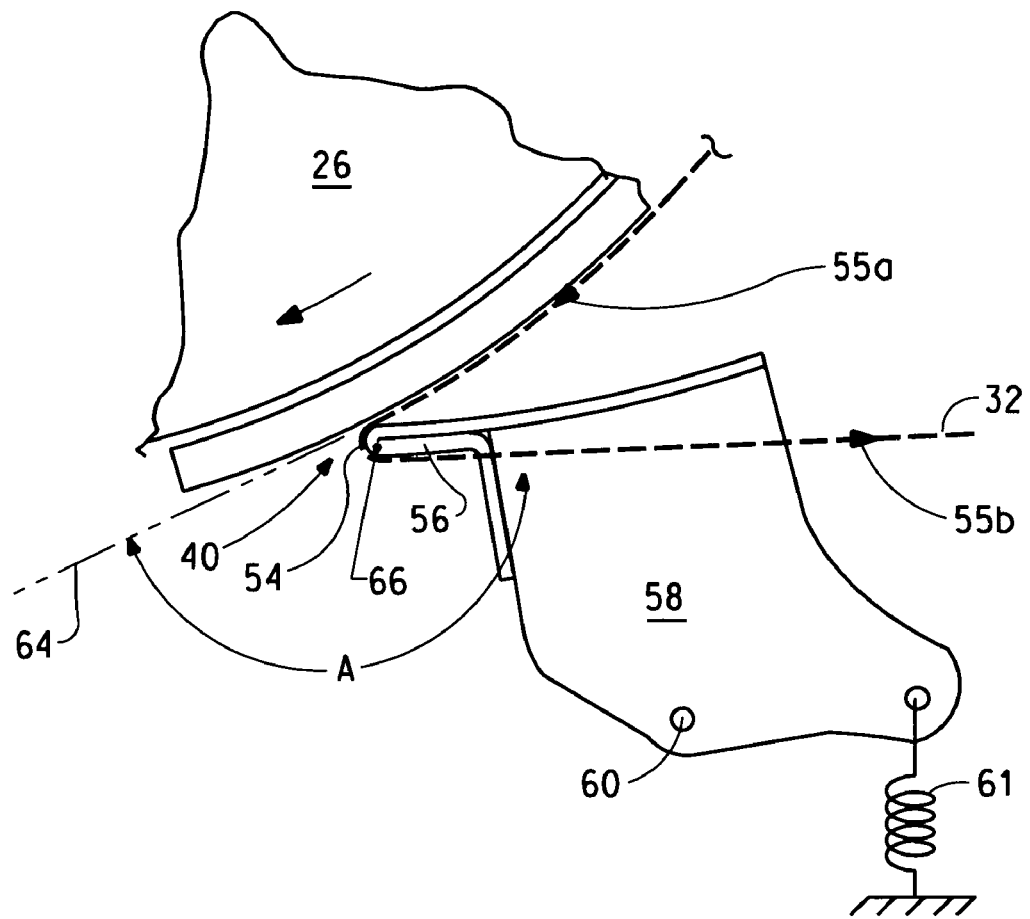
FIG. 2 is a schematic detailed side view of the means for removing the development medium shown in FIG. 1.

FIG. 1 and FIG. 2 show an embodiment of the present invention for use in a thermal processor. A means for contacting 20 the photosensitive element 16 to the development medium 14 includes a means for supporting 22 the photosensitive element 16 and a means for delivering 24 the development medium 14 to the exterior surface 17 of the photosensitive element. The means for supporting 22 is not limited, and can include for example a drum, multiple rolls, and planar supports. In the embodiment shown, the means for supporting 22 the photosensitive element 16 includes a drum 26 acting as a base member, which has an outer surface 27 for supporting the photosensitive element 16. The drum 26 is mounted for rotation on a frame of the processor and rotates in a counter-clockwise direction. The base member is non-flexible or substantially non-flexible support for the photosensitive element 16 such that the base member does not significantly change shape during the thermal development process. The outer surface of the base member may include one or more layers to provide additional functionality to the outer surface, such as resiliency, tackiness, protection, etc. The additional layer as a resilient layer can be composed of any material to suitable to provide a Shore A hardness between about 30 and about 75, such as natural rubbers and elastomeric materials and synthetic rubbers and elastomeric materials, including rubber, silicone rubber, and compressible foams. Particularly preferred are silicone rubber and rubber. The hardness of the layer is important, although not critical to the invention. The resilient surface provided by the resilient layer can result in a longer nip zone as a result of the surface deflecting under the pressure exerted by a hot roll 30. The rubber elasticity also accommodates some minor misalignment between the drum 26 and the hot roll 30. The resilient layer can include metal particles, such as aluminum particles, to improve the heat transfer characteristics of the base member.

The means for delivering 24 includes a hot roll 30 for delivering a continuous web 32 of the development medium 14 to the photosensitive element 16. The hot roll 30 is positioned adjacent the drum 26 which carries the photosensitive element 16. When the means for contacting 20 brings the development medium 14 and the exterior surface 17 of the photosensitive element 16 into contact a nip 34 is formed between the hot roll 30 and the drum 26. The hot roll 30 is preferably metal having an outer surface that may be coated with a layer of an elastomeric material. The hot roll 30 is mounted for rotation to the frame of processor. In one embodiment, the hot roll 30 is driven by friction between its outer surface and the absorbent web 32 contacting the hot roll. The absorbent web 32 is unwound from a supply roll 36. The web 32 is then guided over the hot roll 30, past a means for removing 40 the web from the photosensitive element 16 and wound up on a take up roll 44.

The web 32 may pass over one or more additional rolls from the supply roll 36 to the hot roll 30, and may pass over one or more additional rolls from the hot roll to the take up roll 44. The hot roll 30, supply roll 36, take-up roll 44, and the one or more additional rolls can be mounted for rotation on the frame of the processor or on a carriage that is movable so that it can be rolled out of the frame of the processor when required for servicing. One or more of the additional rolls may guide, idle, and/or drive the web 32 through the processor.

The web 32 is controlled by a means for applying tension 46 to the development medium 14. The means for applying tension 46 is located away from the exterior surface 17 of the element 16, and downstream of the means for removing 40. In the embodiment shown, the web 32 in its path from the removing means 40 to the take-up roll 44 transports about a drive roll 48 having an abrasive outer surface to prevent slippage of the web. A torque motor 48a provides constant torque to the drive roll 48 so as to apply a constant or substantially constant tension to the development medium web 32, at least during removal of the web 32 from the photosensitive element 16. The web 32 contacts the abrasive outer surface of the drive roll 48 and can loop over one or more idler rolls 49 to aid in providing a substantially uniform tension to the web after the hot roll 30. The tension required to remove the web 32 from the photosensitive element 16 may change with each cycle or subsequent cycles of removing for a given photosensitive element. As such, a controller (not shown) for the torque motor 48a can adjust the torque so that the tension in the web 32 is accordingly changed. In one embodiment, the torque motor 48a will adjust the torque to increase the tension required to remove the web 32 from the element 16 with later cycles of web removal for a particular element. Other embodiments implementing constant or substantially constant tension of the web after the means for removing 40, can be contemplated by those skilled in the art. A suitable range of the tension in the web 32 for the tensioning means 46 is from about 0.3 to 2 lbs/in (0.5 to 3.5 Newtons/cm) in one embodiment, and in another embodiment 0.5 to 1.0 lbs/in (0.875 to 1.75 Newtons/cm).

Additional means for applying tension 50 to the web 32 may be included as necessary to maintain tension in the web 32 throughout its transport path. In the embodiment shown, downstream of the means for applying tension 46, the web 32 wraps about one or more of the additional rolls 49 that include a braking mechanism 51 as the additional means for applying tension 50 to maintain web tension in its transport path from the applying tension means 46 to the take up roll 44. Similarly on the supply side, one or more of the additional rolls 49 may also include a braking mechanism 51 to maintain tension of the web 32 in its transport path from the supply roll to the nip 34. The brake mechanism 51 provides resistance (i.e., tension) to the supply roll 36 to prevent the web 32 from over dispensing during processing. In alternate embodiments, the brake mechanism and/or other additional means for applying tension 50 can be included with the supply roll 36 and/or the take up roll 44. It is well within the skill of those in the art to contemplate other embodiments of providing tension to the web between the supply roll 36 and the nip 34, and from the tensioning means 46 to the take up roll 44.

The tension of the web 32 along its path can be the same or different in each region maintained by the means for applying tension 46 and the additional means for applying tension 50. In particular, the tension of the web 32 from the supply roll 36 to the nip 34, i.e., supply tension, is different from the tension being maintained in the web 32 by the means for applying tension 46 after the means for removing 40, i.e., removing tension. In one embodiment when the development medium 14 and the element 16 are in contact at the nip 34, the supply tension of the web 32 is higher than the removing tension of the web, preferably the supply tension is greater than 1.5 times the removing tension, and most preferably the supply tension is 2 times the removing tension.

The processor is provided with a means for relative motion 52 between the drum 26 and the hot roll 30, so that the photosensitive element 16 and the web 32 of the development medium 14 can be brought into contact with the other. Means for providing relative movement can be accomplished, for example, by mounting the hot roll 30 (and/or drum 26) onto a mounting bracket 53 that is supported on the frame and actuating the bracket 53 to move the hot roll 30 toward the photosensitive element 16. When the hot roll 30 moves toward the drum 26, the nip 34 is formed between the photosensitive element 16 (supported by the base member) and the hot roll 30 with the development medium 14 between the element and the hot roll. The nip 34 is the location where the hot roll 30 is in an engaged position against the drum 26. The hot roll 30 carrying the web 32 is engaged against the photosensitive element 16 in pressure contact. Providing such means for relative motion is described in U.S. Pat. No. 5,279,697 (Peterson et al.) and WO 2001/18604. It is desirable to apply a uniform or substantially uniform pressure at the nip 34 across the width of the element 16 during processing. This uniform pressure assumes that the image across the nip is uniform; those skilled in the art will recognize that the pressure applied will vary locally as image elements pass through the nip. Pressure is applied to force the absorbent web into intimate contact with the photosensitive element 16. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the element surface to the absorbent web without distorting the composite photosensitive element.

Located away from the means for contacting 20 the web 32 to the photosensitive element 16 is the means for removing 40 the web from the photosensitive element. As such, the web 32 remains in contact with the exterior surface 17 of the photosensitive element 16 beyond the nip 34, and even remains in contact with the photosensitive element beyond a point at which the web would continue its wrap about the hot roll 30 (if no removing means were present). The web 32 and the photosensitive element 16 can remain in contact after the nip 34 for any distance to reach the means for removing 40 the web. It is desirable to have the point where the web 32 is removed from the element 16 close to the nip 34 to minimize the effects of the molten polymer cooling while in contact with the development medium 14. If the molten polymer cools too much while in contact with the web 32 it may be difficult to separate the web from the element 16 and in some cases the web may even tear. However, locating the means for removing 40 to be close to the nip 34 is limited by the removing structure or member that can fit in the space after the nip and materials that can resist bending and torsion. In one embodiment where the nip 34 is formed between two rolls (i.e., hot roll and drum) the distance from the means for contacting 20 at the nip to the means for removing 40 where the web 32 is peeled from the element 16 is generally greater than 0.5 inch (1.27 cm). In another embodiment the distance from the means for contacting 20 at the nip 34 to the means for removing 30 where the web 32 is peeled from the element 16 is 2 to 4 inch (5.1 to 10.2 cm), and preferably about 3 inch (7.6 cm). The means for removing 40 is located adjacent to the means for contacting 20 and adjacent the exterior surface 17 of the photosensitive element 16. The means for removing 40 can be part of but located away, or separate from, the means for contacting 20. In FIGS. 1 and 2, the means for removing 40 is separate from the means for contacting 20. The removing means 40 removes or peels the web 32 from the photosensitive element 16 along an entire or substantially entire transverse dimension (i.e., width) of the photosensitive element.

In FIGS. 1 and 2, the means for removing 40 establishes a consistent location adjacent the exterior surface 17 of the photosensitive element 16 at which the web 32 separates from the element. The means for removing 40 can aid in keeping the photosensitive element 16 held to the drum surface 27 during web separation, eliminating, reducing, or at least controlling the lifting and sagging experienced by photosensitive elements in thermal processors of the prior art. While so doing the strains induced by the separating web 32 on the photosensitive element 16 while still hot are minimized or substantially eliminated. However, as the means for removing 40 is positioned farther away from the exterior surface 17, the location at which the web 32 separates from the element 16 may move closer to the nip 34 and the web may not separate from the element consistently at the same location. Some inconsistency in the location of the separation of the web 32 from the element 16 may be acceptable in some cases, since this is still an improvement over prior art processors.

The means for removing 40 can be any shape, provided that the shape includes a peeling surface or edge 54 at which the web 32 can change direction from a first direction 55a where the web travels in contact with the photosensitive element to a second direction 55b where the web ultimately returns to the take up roll 44. Examples of shapes for the means for removing 40 include, but are not limited to, a blade, a roller, a roller backed by one or more support rollers, an elliptical-shaped member, a wedge and combinations thereof. The means for removing 40 can be formed from any material suitable for use including, but not limited to, sheet metal, cast metal, machined metal, alloys, polymer composite materials, thermoplastic materials, thermoset materials, and combinations thereof. The material chosen for the means for removing 40 should be resistant to thermal distortion at the temperatures associated with thermal processing, and able to resist displacement, i.e., bending and torsion, under the operating tension forces (of the web) in the process. In the embodiment shown in FIGS. 1 and 2, the means for removing 40 is a blade 56 formed of sheet metal.

The removing means 40 can be secured in place by mounting each end to the frame of the processor. Alternatively, the removing means 40 can be mounted onto a support bracket 58 that is secured at each end in the frame of the processor. In one embodiment, the means for removing 40 is held in a fixed position relative to the outer surface 27 of the drum 26. In another embodiment, the means for removing 40 is held in a fixed position relative to the exterior surface 17 of the photosensitive element 16. Either of these previous embodiments may be particularly useful in thermal processors that develop photosensitive elements of one thickness or a narrow range of thickness. In another embodiment, the means for removing 40 (or the bracket 58) is mounted such that the means for removing can move rotationally about a pivot point 60 as the web 32 is peeled from the photosensitive element 16. In this embodiment the removing means 40 can automatically adjust to photosensitive elements of different thickness that may be developed in the thermal processor. In the embodiment shown in FIGS. 1 and 2, the pivot point 60 is located below the path of the web 32 as it travels to the take-up roll 44. In this case due to the tension in the web 32, the bracket 58 will rotate the peeling edge 54 of the blade 56 clockwise towards the exterior surface 17 of photosensitive element 16. The rotating motion of the blade 56 may be sufficient to position the peeling edge 54 directing the web 32 to abut the exterior surface 17 of the photosensitive element 16. The peeling edge 54 abutting the exterior surface 17 (with the web in between) will assist in holding the photosensitive element 16 against the base member as the web 32 is pulled away. Additionally, the peeling edge 54 of the removing means 40 can float against or move to adjust to the topography of the surface 17 that changes as the relief image forms in the element 16.

In an alternate embodiment (not shown), the pivot point for the removing means 40 is located above the path of the web 32 as the web returns to the take-up roll 44. In this case due to the tension in the web 32, the removing means 40 will rotate the peeling edge 54 of the removing member counterclockwise, away from the exterior surface 17 of photosensitive element 16. This embodiment may be useful where there are constraints for space in the processor. The counterclockwise rotation may be countered by a means for actuating to direct the peeling edge 54 back toward the exterior surface 17 of the photosensitive element 16.

Regardless of the direction of rotation about the pivot point 60, it may be useful to include a means for actuating the removing means 40 relative to the exterior surface 17 of the element 16, and/or a means for controlling the position of the removing means, and/or the peeling edge 54. In the embodiment shown a spring 61 is the means for actuating the removing means 40. The spring 61 is attached to the support bracket 58 and mounted to the frame of the processor. The spring 61 aids in rotating the blade 56 toward the element 16, and keeps the peeling edge 54 pressed against the web 32 on the element 16 while moving to adjust to the surface topography. Other examples of devices or mechanisms that are suitable for the means for actuating include torsion elements and motors. Examples of devices or mechanisms that are suitable for the means for controlling include position sensors, mechanical stops, and controllers. It is well within the skill of a person in the art to select and incorporate a suitable device to accomplish the means for controlling as well as the means for actuating the removing means 40 in the thermal processor. The means for controlling the position of the peeling edge can be particularly useful to accommodate thermal processing of various photosensitive elements each having composition layers of different thickness.

The means for removing 40 includes the peeling edge 54 at which the web 32 changes direction to remove, or peel, or separate the web from the photosensitive element 16 while the element continues travel on the base member (i.e., drum 26). As such, the means for removing 40 removes or peels the development medium 14 at a peel angle, A, greater than or equal to 90 degrees relative to a tangent 64 of the exterior surface 17 of the photosensitive element 16 in the process direction, at a point of separation, that is, at a point of contact of the peeling edge 54 to the web 32 and photosensitive element 16, or at a projected intersection of web removal from the element 16.

The means for removing 40 utilizes beam strength associated with the photosensitive element 16 to resist the deformation of the element from the force of separating the web 32 from the element. Beam strength is the ability of an object of a particular construction and geometry to resist changing its shape under the application of perturbing forces and moments. Particularly in the embodiment where the means for removing 40 includes a peeling edge 54 that abuts the web 32 residing on the exterior surface 17 of the photosensitive element 16, the means for removing 40 aids in keeping the element 16 held to the drum surface 27 during separation of the web 32 and essentially shortens the length of the element that can lift and bend from the drum 26 to thereby increase the beam strength of the element at the web separation location. As such the photosensitive element 16 has the needed beam strength to resist the pulling force of the development medium web and significantly reduces or eliminates bending while still hot so that deformations are not induced into the element.

The peeling edge 54 includes a radius of curvature 66 around which the web 32 wraps to change from the first direction 55a to the second direction 55b during removing. The development medium web 32 should be able to conform or substantially conform to the radius of curvature 66 of the peeling edge 54 while peeling. An advantage of the means for removing 40 being located away from the means for contacting 20 is that the means for removing can provide a different radius of curvature 66 about which the web 32 peels from the element than is provided when the web is peeling about the circumferential outer surface (i.e., radius of curvature) of the hot roll at the same location as the contacting of the web to the element. A small radius of curvature 66 of the peeling edge 54 will generally provide a peeling point location (versus an arc) along the transverse direction of the element 16 with a sharp change of direction for the web 32 to peel away from the element. The radius of curvature 66 suitable for a particular embodiment of the removing member can depend on several factors including, but not limited to, thickness of the composition layer, width of the element, modulus of elasticity of the photosensitive element at temperatures that the web is peeled, and force required to remove the web from the element, and assumes a nondeformable or substantially nondeformable removing member. It should be understood that the radius of curvature of the peeling edge 54 should be less than a radius of curvature associated with the hot roll 30, that is, less than about 1.5 in (3.75 cm). However to more fully realize the advantages of the present invention, the radius of curvature 66 of the peeling edge 54 should be in the order of 0.5 inch or less. In the case in which the means for removing 40 is a roller, the roller should have a radius small enough so that a circumferential surface of the roller essentially acts as the peeling edge 54 with the radius of curvature 66 on the order of 0.5 inch (1.3 cm) or less. The radius of curvature 66 of the peeling edge 54 can be less than 0.25 inch (0.64 cm) for alternate embodiments of the removing means 40. In the embodiment shown, the blade 56 has peeling edge 54 with a radius of curvature 66 of about 0.05 inch (1.3 cm).

The removing means 40 can have one or more surfaces or edges 54 which can be coated or textured or have a textured coating so that the removing means 40 provides no or minimum resistance to the movement of the web 32 of the development medium 14. In one embodiment, the peeling edge 54 is coated with a non-stick material such as a suitable TEFLON® fluoropolymer.

The present invention where the means for removing 40 of the development medium 14 from the photosensitive element 32 is located away from where the development medium is brought into contact with the element provides for controlled and uniform or substantially uniform peeling of the development medium from the element. The means for removing 40 can establish a consistent location adjacent the exterior surface 17 of the element 16 at which the element separates itself from the web 32. The means for removing 40 abuts the exterior surface 17 to assist in holding the photosensitive element 16 in a prescribed location while still hot while the development medium 14 peels from the element 16. The photosensitive element 16 may be held against the outer surface 27 such that the element does not bend or lift as the development medium 14 peels from the element. Alternatively, the means for removing 40 may be positioned such that the photosensitive element 16 slightly lifts from the outer surface 27 in a consistent manner to abut against the peeling surface 54 as the development medium 14 peels from the element. As a result, the photosensitive element 16 does not experience or only minimally experiences non-uniform strains so that the stresses of this part of the process are effectively not induced into the element. Printing elements resulting from the thermal development process of the present invention do not have or have reduced wave deformations, that is, no or substantially no non-planar topography of the printing regions of the relief structure. The printing elements resulting from the present invention thus have improved print performance compared to printing elements that are thermally developed in processor that does not include a means for removing the development medium from the element located away from the means for contacting.

The present invention has an additional advantage of reducing the amount of vapor created by the thermal development process. Photosensitive compositions may contain one or more components that can vaporize or volatilize when the element is heated to the temperature or temperatures necessary for thermal development to occur. The components that can vaporize or volatilize are generally low molecular weight compounds including monomer. The vapor can condense within the apparatus and drip uncontrolled onto different areas of the apparatus creating a mess. After the nip where the development medium contacts the photosensitive element, the development medium contains the liquefied portions from the element. Continued contact of the development medium 14 with the hot roll 30 beyond the nip heat the liquefied portions carried in the development medium and thus generate vapor. In the present invention where the means for removing 40 is located away from the means for contacting 20, the development medium traversing the means for removing prevents or reduces contact of the development medium 14 to the hot roll 30 after the nip 34. The development medium 14 is not heated after the nip 34, so that the vapor (as well as the condensate) generated by thermal development is reduced.

The base member or drum 26 may be equipped with a heater (not shown), which is provided to keep the photosensitive element 16 at a stable starting temperature independent of the surrounding environment. Any means of heating the base member is acceptable, as long as the power capacity of the heater is sufficient to maintain a fairly constant selected skin temperature on the outer surface 22 of the drum 18 of about 50-150° F. (10-65.6° C.), preferably 70 to 95° F. (21.1-35° C.). The means for heating the drum 26 is capable of heating the drum 26 to a temperature capable of heating the exterior surface 17 of the element 16 to a temperature T3. The heater may be an electrical heating blanket, such as a wire wound blanket. If the normal operating environment is carefully controlled to be at a constant temperature, the heater can be turned off or omitted from the apparatus. As is disclosed in WO 2001/18604, it is also possible that the drum 26 be cooled by cooling means, such as, a blower directing a stream of air at the surface 17 of the photosensitive element 16 and the drum and/or by the circulating of cooling fluid beneath the surface of the drum to cool the support side of the element.

The processor may include another heating means (not shown) located adjacent the drum 26. The first heating means can be a focused radiant heater directed at an exterior surface 17 of the photosensitive element 16 on the drum 26 to apply heat to the surface and elevate the temperature of the surface to a temperature T1. In one embodiment, the radiant heater elevates the temperature of the exterior surface 17 to a temperature sufficient to melt the unirradiated portion of the composition layer, causing a portion of the layer to liquefy. The heater can include a one or a plurality of tubular infrared heating bulb/s mounted in end supports that also provide electrical connections to the bulb/s. The heater can also include a reflector adjacent to the bulb/s that acts to focus and direct the infrared radiation toward the exterior surface 17 of the photosensitive element sheet 16.

The processor includes a means for heating (not shown) the hot roll 30. The hot roll 30 maintains or further elevates the temperature of the exterior surface 17 of the element 16 to temperature T2. Heat is provided to the hot roll 30 by a core heater, such as a cartridge heater, available from Watlow Electric Company (St. Louis, Mo.). In addition to electrical core heating, the hot roll 30 can be heated by any method including steam, oil, hot air, and other heating sources that can provide a temperature of the outer surface of the hot roll sufficient to melt a portion of the composition layer through the development medium 14. The hot roll 30 applies heat to the exterior surface 17 of the photosensitive element 16. Upon contact of the development medium 14 backed by the hot roll 30 to the photosensitive element 16, the uncured portions of the composition layer of the element that melt, soften, or flow, are absorbed into or captured by the development medium 14. Temperature sensors may be mounted throughout the processor to monitor the temperature for the purpose of controlling the heating elements in the drum 26, hot roll 30 and optional radiant heater.

The radiant heater acting as a first heating means, the hot roll 30 acting as a second heating means, and the drum heater acting as a third heating means, independently or in any combination, are capable of heating the exterior surface 17 of the photosensitive element 16 to a temperature sufficient to cause a portion, i.e., an unirradiated portion, of the composition layer to liquefy at Tr. The first heating means, the second heating means, and the third heating means independently or in any combination constitute a heating station. A preferred heating station includes the first heating means and the second heating means.

The operation of the process for thermally developing the photosensitive element begins with placing the photosensitive element 16 on to the drum 26. The drum heater or the radiant heater may be used to preheat the drum 26. The cartridge heater for the hot roll 30 preheats the hot roll. The drum 26 starts turning and carries the element 16 with it. The radiant heater may preheat the bulbs before the element 16 reaches the heater, and then switch to an operating setting to achieve the desired temperature T1 for melting the composition layer of the element 16. As a leading edge of the element 16 reaches the position where the web 32 being carried by the hot roll 30 will contact the drum 26, the hot roll 30 moves to bring the absorbent web 32 against the element 16. The photosensitive element composition layer is heated to between 40 and 230° C. (104-392° F.) while in contact with the development medium 14. The development medium 14 contacts the exterior surface 17 of the heated photosensitive element 16, and absorbs the liquefied portions of the elastomeric polymer from the unirradiated portions of the composition layer. By maintaining more or less intimate contact of the absorbent material 14 with the exterior surface 17 of the element 16, a transfer of the uncured regions of the composition layer that are molten, softened, or flowing; and, of any additional layers on the composition layer that are molten, softened, or flowing at the thermal development temperature of the composition layer, to the absorbent material 14 takes place. Intimate contact of the development medium 14 to the exterior surface 17 and the photopolymerizable layer may be maintained by the pressing the layer and the development medium 14 together at the nip 34. The element 16 and the web 32 remain contact until reaching a location away from the contact nip 34 where the blade 56 of the means for removing 40 is positioned against the exterior surface 17 with the development medium 14 in between. The application of tension in the web will cause the bracket 58 to rotate the peeling edge 54 of the blade 56 about the pivot point 60 clockwise towards the exterior surface 17 of the element 16. The peeling edge 54 abuts the surface 17 to assist in holding the photosensitive element 16 in a prescribed location (which may or may not be against the drum 26) as the web 32 peels from the element that continues rotation on the drum 26. The development medium web 32 traverses the peeling edge 54 to sharply change direction from traveling with the element 16 to return to the take-up roll 44, and removes, separates or peels the development medium 14 from the exterior surface 17 of the element. A relief structure forms in the element 16 as the element separates from the development medium web 32. As a trailing edge of the element 16 passes the hot roll/drum contact point, i.e., nip 34, the radiant heater may cool down or turn off, and the hot roll 30 will retract away from the nip 34. As the trailing edge passes the blade 54, the web 32 is stopped. The drum 26 may return the leading edge of the element 16 to the start position to begin another cycle of heating the element 16, contacting the web 32 to the element, and removing the web from the element. A cycle of the steps of heating the element 16, contacting the layer with the development medium 14, and removing the development medium 14 can be repeated as many times as necessary to adequately extract the uncured material from the composition layer and create sufficient relief depth. However, it is desirable to minimize the number of cycles for suitable system performance, and typically the photopolymerizable element is thermally treated for 5 to 15 cycles in order to form a flexographic printing form having a relief pattern or surface suitable for printing.

PHOTOSENSITIVE ELEMENT

The present invention is not limited to the type of element that is thermally processed. In one embodiment, the photosensitive element 16 includes a flexible substrate and a composition layer mounted on the substrate. The composition layer is at least one layer on the substrate capable of being partially liquefied. Preferably, the photosensitive element 16 is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature Tr sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753, 865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, an actinic radiation opaque layer, a barrier layer, and combinations thereof. The one or more additional layers preferably are removable, in whole or in part, by contact with the development medium in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with an absorbent material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Infrared-sensitive layers and actinic radiation opaque layers are well known in the art. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. No. 5,262,275; U.S. Pat. No. 5,719,009; U.S. Pat. No. 5,607,814; U.S. Pat. No. 5,506,086; U.S. Pat. No. 5,766,819; U.S. Pat. No. 5,840,463; and EP 0 741 330 A1. The infrared-sensitive layer preferably is removable by contact with an absorbent material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester.

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element 16 is prepared for thermal development by imagewise exposing the element 16 to actinic radiation. After imagewise exposure, the photosensitive element 16 contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. Nos. 5,262,275; 5,719,009; 5,607,814; 5,506,086; 5,766,819; 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element 16 is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

The development medium is selected to have a melt temperature exceeding the melt or softening or liquefying temperature of the unirradiated or uncured portions of the radiation curable composition and having good tear resistance at the same operating temperatures. Preferably, the selected material withstands temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. It is also desirable that fibers are bonded in an absorbent material so that the fibers are not deposited into the plate during development. A non-woven nylon web is preferred.

After thermal development, the flexographic printing form may be post exposed and/or chemically or physically after-treated in any sequence to detackify the surface of the flexographic printing form.

What is claimed is:

1. An apparatus for forming a relief pattern from a photosensitive element having an exterior surface and containing a composition layer capable of being partially liquefied, comprising:
   means for heating the exterior surface to a temperature sufficient to cause a portion of the layer to liquefy;
   means for contacting the exterior surface to a development medium;
   means located away from the exterior surface for applying tension to the development medium; and
   means located adjacent the exterior surface for removing the development medium from the exterior surface;
   wherein the means for removing is located away from the means for contacting and allows the development medium to remain in contact with the exterior surface beyond the nip.

2. The apparatus of claim 1 wherein the means for removing is separate from the means for contacting, 3. The apparatus of claim 1 wherein the means for removing and the means for contacting are a single structure.

4. The apparatus of claim 1 wherein the means for removing is located greater than 0.5 inch from the means for contacting.

5. The apparatus of claim 1 wherein the means for contacting further comprises:
   means for supporting the photosensitive element on a base member; and
   means for delivering the development medium to the exterior surface.

6. The apparatus of claim 5 wherein the means for heaving is selected from the group consisting of:
   a first heating means that applies heat to the exterior surface of the composition layer adjacent where the development medium contacts the layer, the first healing adapted to heat the exterior surface of the layer;
   a second heating means to heat the means for delivering to a temperature capable of heating the exterior surface of the composition layer while the development medium is contacting the exterior surface of the layer;
   a third heating means to heat the means for supporting to a temperature capable of heating the exterior surface of the composition layer
   combination of the first heating means and the second heating means;
   combination of the first heating means and the third heating means;
   combination of the second heating means and the third heating means; and
   combination of the first heating means, the second heating means, and the third heating means,
   wherein the first heating means, the second beating means, and the third heating means, individually or in the above combinations, is capable of heating the exterior surface of the composition layer sufficiently to cause a portion of the layer to liquefy 7. The apparatus of claim 1 wherein the means for removing removes the development medium at a peel angle greater than or equal to 90 degrees relative to a tangent of the exterior surface of the photosensitive element.

8. The apparatus of claim 1 wherein the means for applying tension tensions the development medium about from 0.3 to 2 pounds per inch.

9. The apparatus of claim 1 wherein the means for removing is selected from the group consisting of a blade, a roller, a roller backed by one or more support rollers, an elliptical-shaped member, a wedge, and combinations thereof.

10. The apparatus of claim 1 wherein the means for removing is made from a material selected from the group consisting of sheet metal, cast metal, machined metal, alloys, polymer composite materials, thermoplastic materials, thermoset materials, and combinations thereof.

11. The apparatus of claim 1 wherein the means for removing comprises a non-stick surface.

12. The apparatus of claim 1 wherein the means for removing further comprises a surface having a coating, texturing, or a combination of textured coating.

13. The apparatus of claim 1 wherein the means for removing is in a fixed position relative to the exterior surface of the photosensitive element.

14. The apparatus of claim 1 wherein the means for removing moves relative to the exterior surface of the photosensitive element.

15. The apparatus of claim 1 further comprising means for moving the means for removing.

16. The apparatus of claim 1 wherein the means for removing rotates about a pivot point.

17. The apparatus of claim 16 wherein the means for removing rotates towards the exterior surface of the photosensitive element.

18. The apparatus of claim 16 wherein the means for removing rotates away from the exterior surface of the photosensitive element.

19. The apparatus of claim 18 further comprising an actuating means to counter the rotation of the means for removing.

20. The apparatus of claim 1 wherein the means for removing comprises a peeling edge.

21. The apparatus of claim 20 wherein the exterior surface has a topography, further comprising means for activating means for removing so that the peeling edge adjusts to the topography of the exterior surface.

22. The apparatus of claim 20 wherein the exterior surface has a topography, further comprising means for pressing the peeling edge to follow the topography of the exterior surface.

23. The apparatus of claim 20 further comprising means for positioning the peeling edge.

24. The apparatus of claim 23 further comprising means for controlling a position of the peeling edge relative to a fixed location in the apparatus.

25. The apparatus of claim 20 wherein the peeling edge has a radius of curvature less than 0.5 inch.

26. The apparatus of claim 20 wherein the peeling edge has a radius of curvature less than 0.25 inch.

27. The apparatus of claim 20 wherein the peeling edge has a radius of curvature less than 0.05 inch.

28. The apparatus of claim 1 further comprising means for maintaining constant tension in the development medium.

29. The apparatus of claim 28 wherein the means for applying tension is downstream of the removing means.

30. The apparatus of claim 28 wherein the means for applying tension comprises tensioning a supply tension to the development medium between a supply roll for the development medium and the means for contacting, and tensioning a removing tension to the development medium downstream of the removing means, and wherein the supply tension and the removing tension can be the same or different.

31. The apparatus of claim 30 wherein the supply tension is greater than the removing tension.

32. The apparatus of claim 1 wherein the means for applying tension to the development medium occurs at a first tension for a first removal of the development medium from the photosensitive element, the apparatus further comprising means for changing the tension of the development medium to a second tension for a second removal of the development medium from the photosensitive element.

33. The apparatus of claim 1 wherein the means for removing comprises a blade having a peeling edge with a radius of curvature of less than 0.05 inch.

34. The apparatus of claim 1, wherein the means for removing further comprises a pivot point and a blade having a peeling edge, and wherein the means for applying tension maintains a constant tension in the development medium after the means for removing to thereby rotate the blade about the pivot point and position the peeling edge on the development medium against the exterior surface.

35. The apparatus of claim 1 wherein the means for contacting allow at least a portion of the liquefied material of the composition layer to be absorbed by the development medium.

36. The apparatus of claim 1 wherein the means for contacting comprises pressing the photosensitive element and the development medium into contact at a pressure sufficient for at least a portion of the liquefied material of the composition layer to be absorbed by the development medium.

37. The apparatus of claim 1 wherein the photosensitive element is a photopolymerizable printing element.

38. The apparatus of claim 1 wherein the means for removing is in a fixed position relative to an outer surface of a means for supporting the photosensitive element.

39. The apparatus of claim 1 wherein the means for removing establishes a consistent location at which the development medium separates from the exterior surface.

40. A method for forming a relief pattern from a photosensitive element having an exterior surface and containing a composition layer capable of being partially liquefied, comprising:
   heating the exterior surface to a temperature sufficient to cause a portion of the layer to liquefy;
   contacting the exterior surface to a development medium at a contact location to form a nip;
   applying tension to the development medium away from the exterior surface; and
   removing the development medium from the exterior surface at a location away from the contact location wherein the development medium remains in contact with the exterior surface beyond the nip.

41. The method of claim 40 wherein the removing step is separate from the contacting step.

42. The method of claim 40 further comprising:
   supporting the photosensitive element on a base member; and delivering the development medium to the exterior surface.

43. The method of claim 40 wherein the removing step removes the development medium at a peel angle greater than or equal to 90 degrees relative to a tangent of the exterior surface of the photosensitive element at a separation point where the development medium separates from the photosensitive element.

44. The method of claim 40 wherein the applying tension is about from 0.3 to 2 pounds per inch.

45. The method of claim 40 wherein the removing step is by a removing member selected from the group consisting of a blade, a roller, a roller backed by one or more support rollers, an elliptical-shaped member, a wedge, and combinations thereof.

46. The method of claim 45 wherein the removing member is shaped from sheet metal, cast metal, machined metal, alloys, polymer composite materials, thermoplastic materials, thermoset materials, or combinations thereof.

47. The method of claim 45 wherein the removing member includes a non-stick surface.

48. The method of claim 45 wherein removing member further comprises a surface having a coating, texturing, or a combination of textured coating.

49. The method of claim 45 further comprising moving the removing member relative to the exterior surface of the photosensitive element.

50. The method of claim 45 further comprising fixing a position of the removing member relative to the exterior surface of the photosensitive element.

51. The method of claim 45 further comprising rotating the removing member about a pivot point.

52. The method of claim 51 wherein the removing member rotates towards the exterior surface of the photosensitive element.

53. The method of claim 51 wherein the removing member rotates away from his exterior surface of the photosensitive element.

54. The method of claim 53 further comprising actuating the removing member to counter the rotation away from the exterior surface.

55. The method of claim 45 wherein the removing member comprises a peeling edge.

56. The method of claim 55 further comprising activating the peeling edge of the removing member to adjust to topography of the exterior surface.

57. The method of claim 55 further comprising pressing the peeling edge to follow topography of the exterior surface.

58. The method of claim 55 further comprising positioning the peeling edge.

59. The method of claim 58 further comprising controlling a position of the peeling edge relative to a fixed location.

60. The method of claim 55 wherein the peeling edge has a radius of curvature less than 0,5 inch.

61. The method of claim 55 wherein the radius of curvature is less than 0.25 inch.

62. The method of claim 55 wherein the radius of curvature is less than 0.05 inch.

63. The method of claim 40 further comprising maintaining a constant tension in the development medium during the removing step.

64. The method of claim 63 further comprising collecting the development medium and maintaining a take up tension which is different from the constant tension for the removing step.

65. The method of claim 40 wherein the development medium is under a first tension, the method further comprising repeating the steps of heating, contacting, applying, and removing, wherein the development medium is under a second tension different from the first tension.

66. The method of claim 40 wherein the applying tension step comprises: tensioning a supply tension to the development medium between a step of supplying the development medium and the contacting step; and tensioning a removing tension to the development medium after the removing step, and wherein the supply tension and the removing tension can be the same or different.

67. The method of claim 66 wherein the supply tension is greater than the removing tension.

68. The method of claim 40 comprising conducting the removing step with a blade-shaped removing member having a peeling edge with a radius of curvature of less than 0.25 inch.

69. The method of claim 40 wherein the removing step comprises removing the development medium with a removing member having a peeling edge and a pivot point, and rotating the removing member about the pivot point and positioning the peeling edge on the development medium against the exterior surface of the photosensitive element.

70. The method of claim 40 wherein the contacting step further comprises absorbing at least a portion of the liquefied material of the composition layer by the development medium.

71. The method of claim 40 wherein the contacting step comprises pressing the photosensitive element and the development medium into contact at a pressure sufficient for at least a portion of the liquefied material of the composition layer to be absorbed by the development medium.

72. The method of claim 40 wherein the photosensitive element is a photopolymerizable printing element.

73. The method of claim 40 wherein the heating step is selected from the group consisting of a first heating that applies heat to the exterior surface of the composition layer adjacent where the development medium contacts the layer, the first heating adapted to heat the exterior surface of the layer;

a second heating to heat a delivering roll to a temperature capable of heating the exterior surface of the composition layer while the development medium is contacting the exterior surface of the layer;

a third heating to heat the base member supporting to a temperature capable of heating the exterior surface of the composition layer;

combination of the first heating and the second heating;

combination of the first heating and the third heating;

combination of the second heating and the third heating; and combination of the first heating, the second heating, and the third heating, wherein the first heating, the second heating, and the third heating, individually or in the above combinations, is capable of heating the exterior surface of the composition layer sufficiently to cause a portion of the layer to liquefy.

74. The method of claim 40 further comprising exposing the photosensitive element to actinic radiation.

75. The method of claim 74 wherein the exposing step is imagewise through an in-situ mask, through a phototool, or by a laser.

76. A flexographic printing form made according to the method of claim 75.

* * * * *